(12) United States Patent
Kron

(10) Patent No.: US 11,877,129 B2
(45) Date of Patent: Jan. 16, 2024

(54) APPARATUS HAVING AN INPUT AND AN OUTPUT AND HAVING AN EFFECT DEVICE WITH VOLUME-REGULATED AUDIO SIGNALS FROM AN AUDIO FILE

(71) Applicant: KRONOTON GMBH, Reinbek (DE)

(72) Inventor: Gunnar Kron, Aumühle (DE)

(73) Assignee: KROTON GMBH, Reinbek (DE)

( * ) Notice: Subject to any disclaimer, the term of this patent is extended or adjusted under 35 U.S.C. 154(b) by 202 days.

(21) Appl. No.: 17/421,968

(22) PCT Filed: Jan. 10, 2020

(86) PCT No.: PCT/DE2020/000003
§ 371 (c)(1),
(2) Date: Jul. 9, 2021

(87) PCT Pub. No.: WO2020/143872
PCT Pub. Date: Jul. 16, 2020

(65) Prior Publication Data
US 2022/0095043 A1    Mar. 24, 2022

(30) Foreign Application Priority Data
Jan. 10, 2019  (DE) ............... 10 2019 100 551.5

(51) Int. Cl.
*H04B 1/00* (2006.01)
*H04R 3/00* (2006.01)
*H04S 7/00* (2006.01)
*H03G 7/00* (2006.01)
*H04S 1/00* (2006.01)

(52) U.S. Cl.
CPC ............... *H04R 3/00* (2013.01); *H04S 7/30* (2013.01); *H04R 2430/01* (2013.01); *H04S 1/002* (2013.01); *H04S 2400/13* (2013.01)

(58) Field of Classification Search
CPC ......... H04R 3/00; H04R 2430/01; H04S 7/30; H04S 1/002; H04S 2400/13
USPC ........................................ 381/86, 303, 106
See application file for complete search history.

(56) References Cited

U.S. PATENT DOCUMENTS

| 3,825,851 A | 7/1974 | Smith |
| 2004/0264714 A1 | 12/2004 | Lu et al. |
| 2015/0205571 A1* | 7/2015 | Duwenhorst ........ G11B 27/031 700/94 |

* cited by examiner

*Primary Examiner* — Ammar T Hamid
(74) *Attorney, Agent, or Firm* — WCF IP

(57) ABSTRACT

The invention relates to an apparatus (100) having an input (11, 12, 15, 16) and an output (13, 14, 17, 18) and having an effect device with volume-regulated audio signals from an audio file or audio source, wherein the audio signals have input levels at an input of the effect device and output levels at an output of the effect device. In order to achieve background sound which is as optimal as possible, the invention proposes that each input level is assigned to a preset output level irrespective of the content of the audio file or audio source, wherein the input level is regulated to the output level.

14 Claims, 12 Drawing Sheets

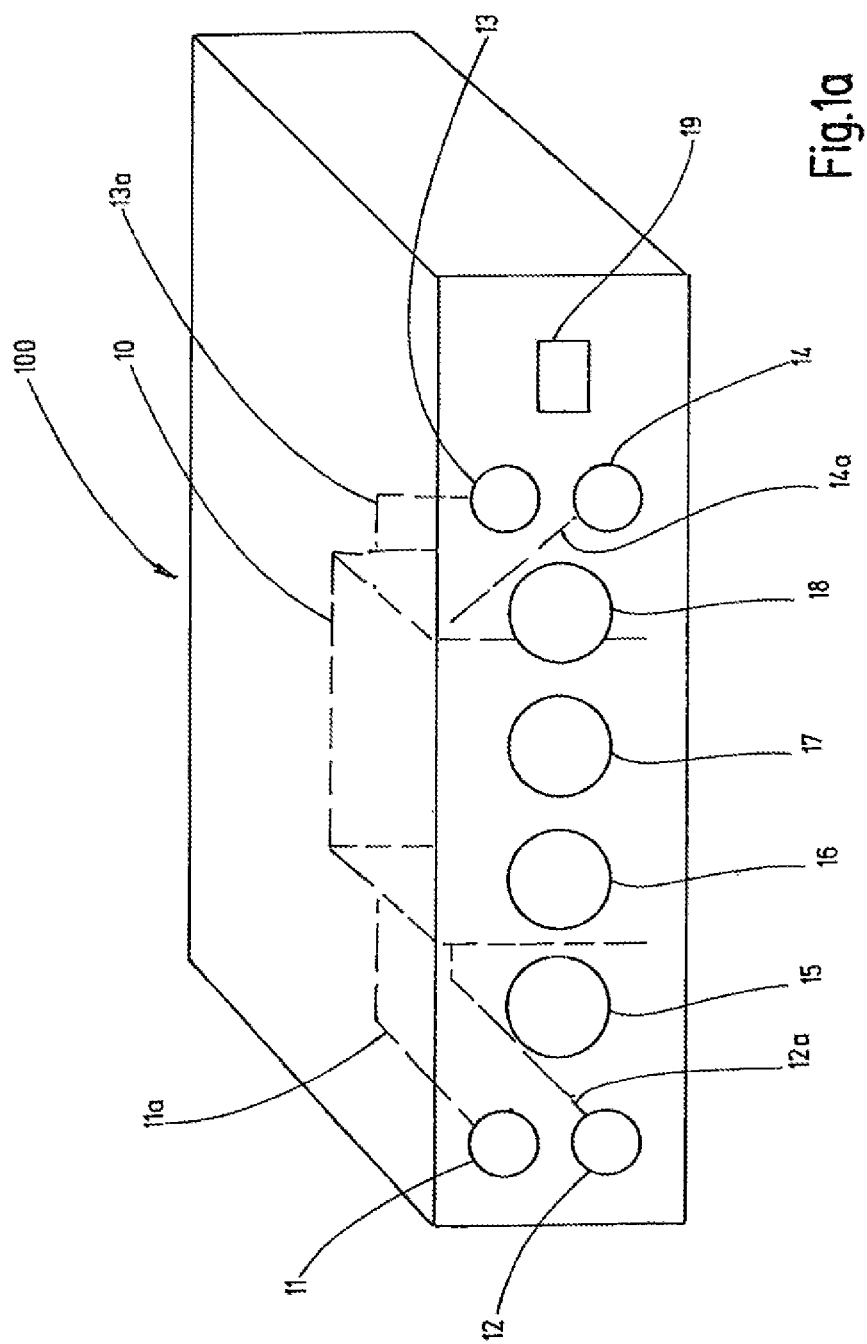

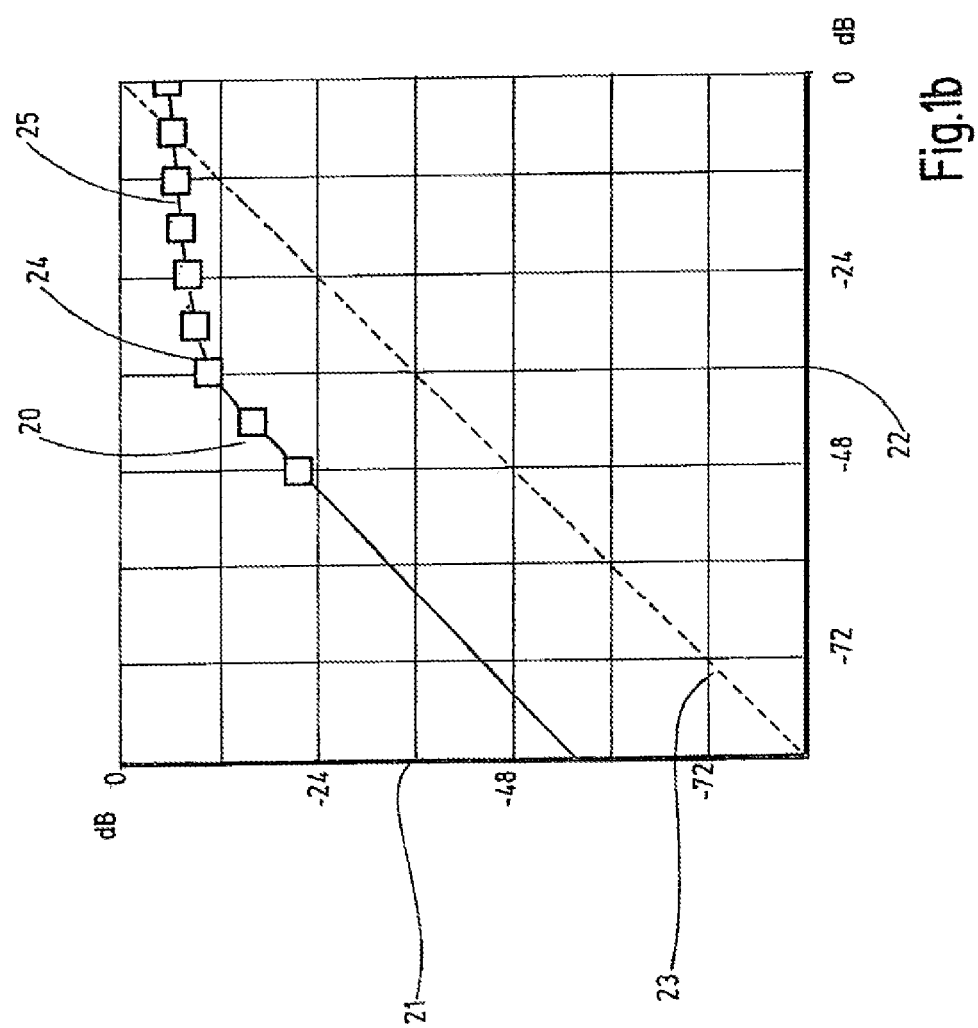

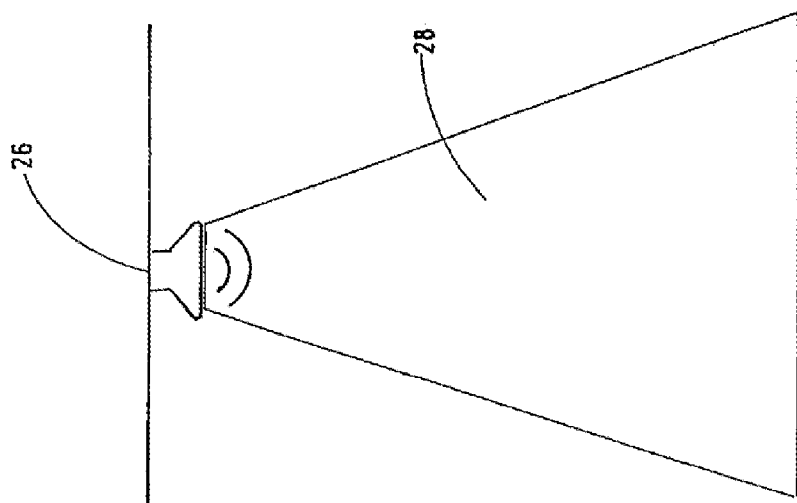
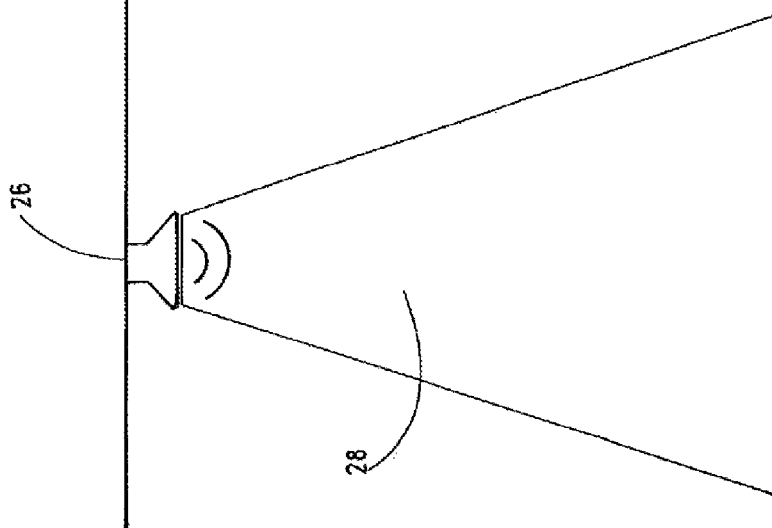
Fig.2a

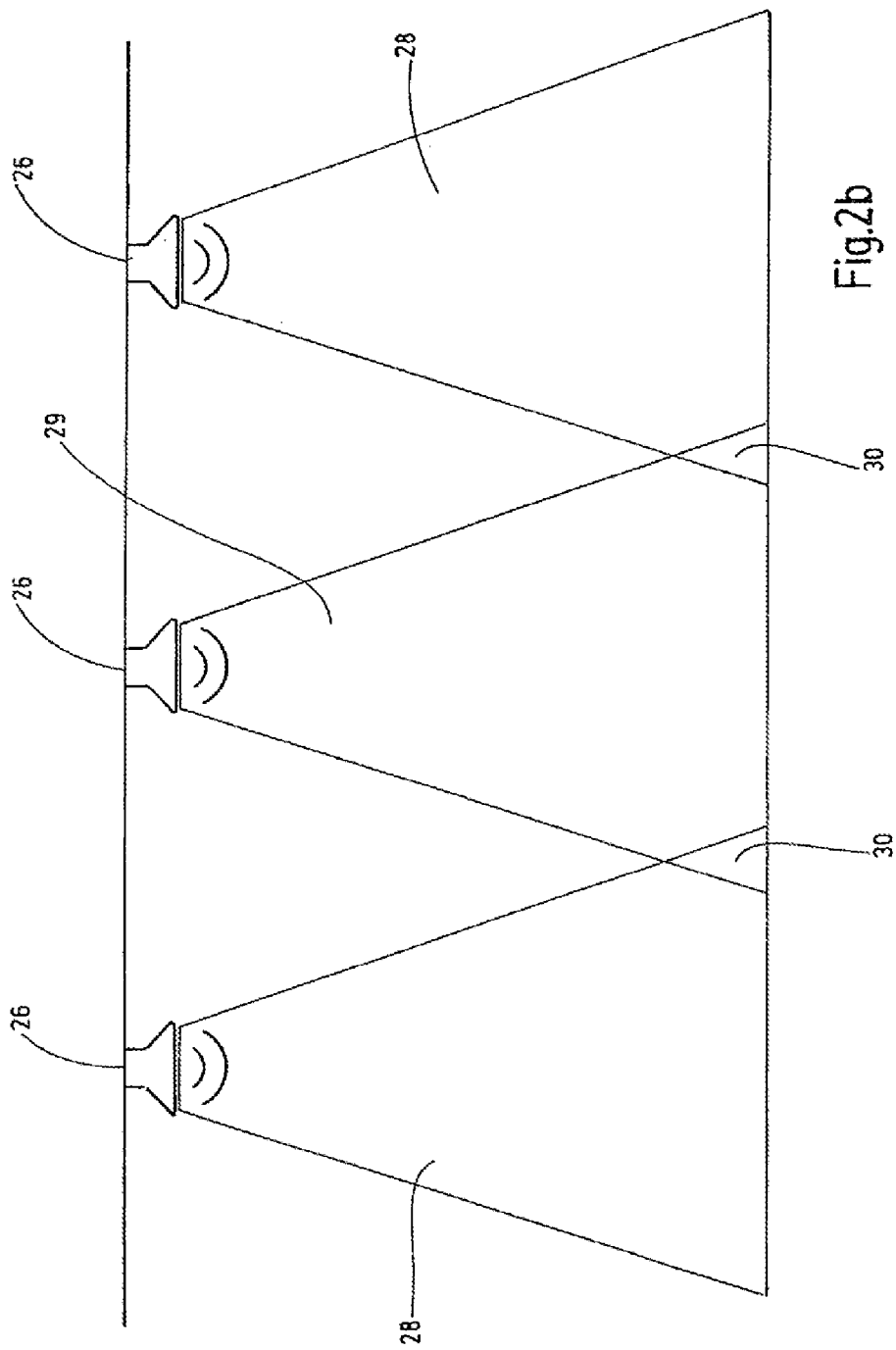

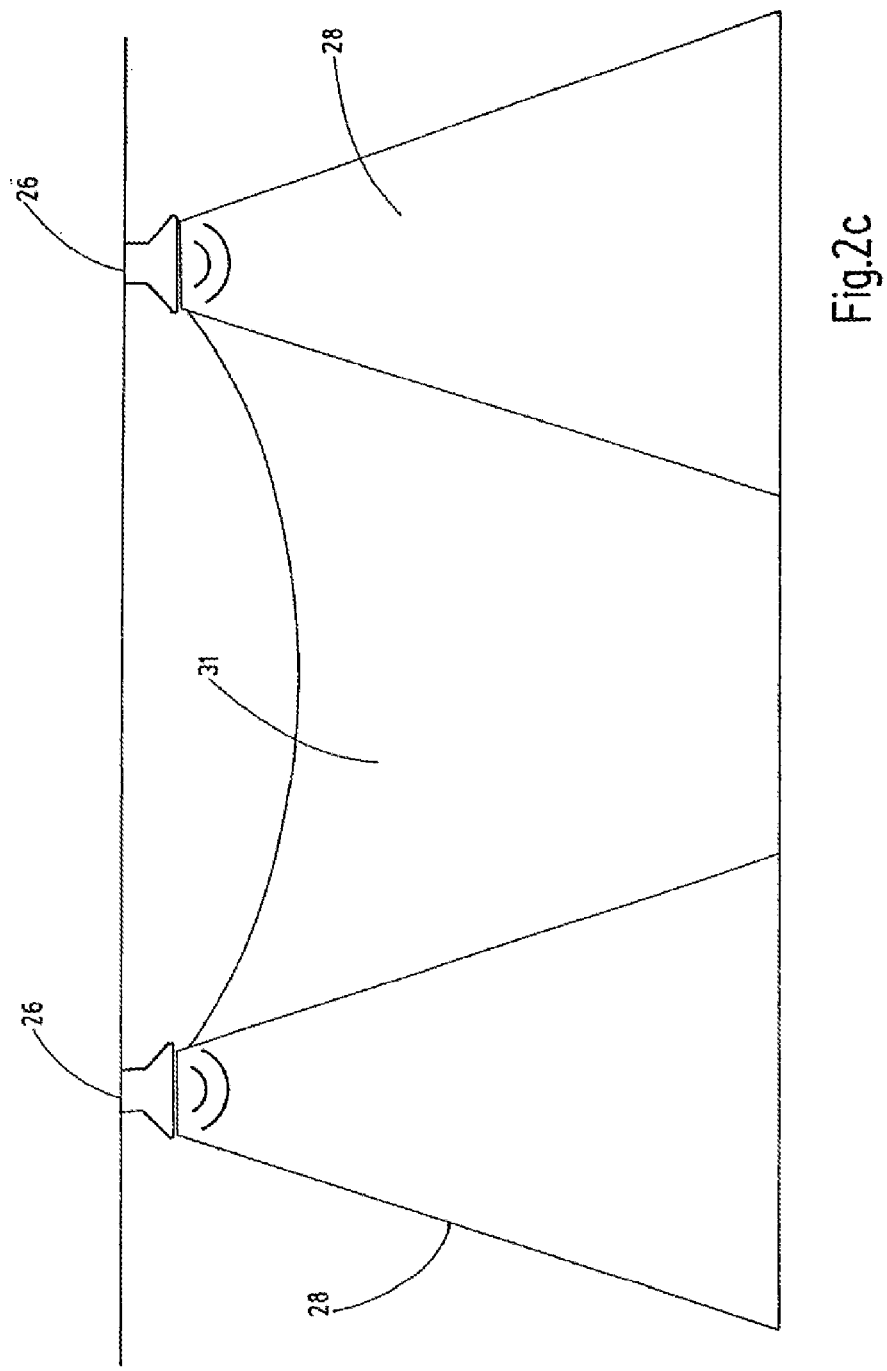

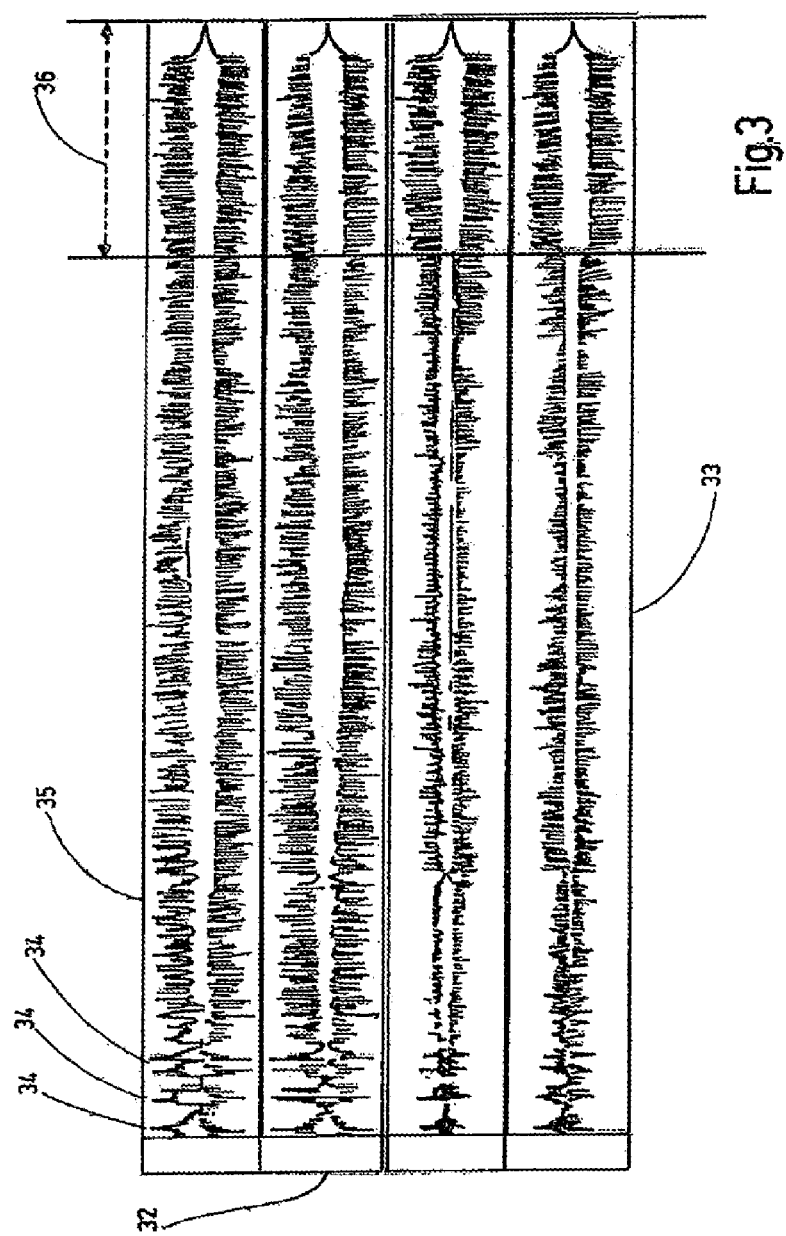

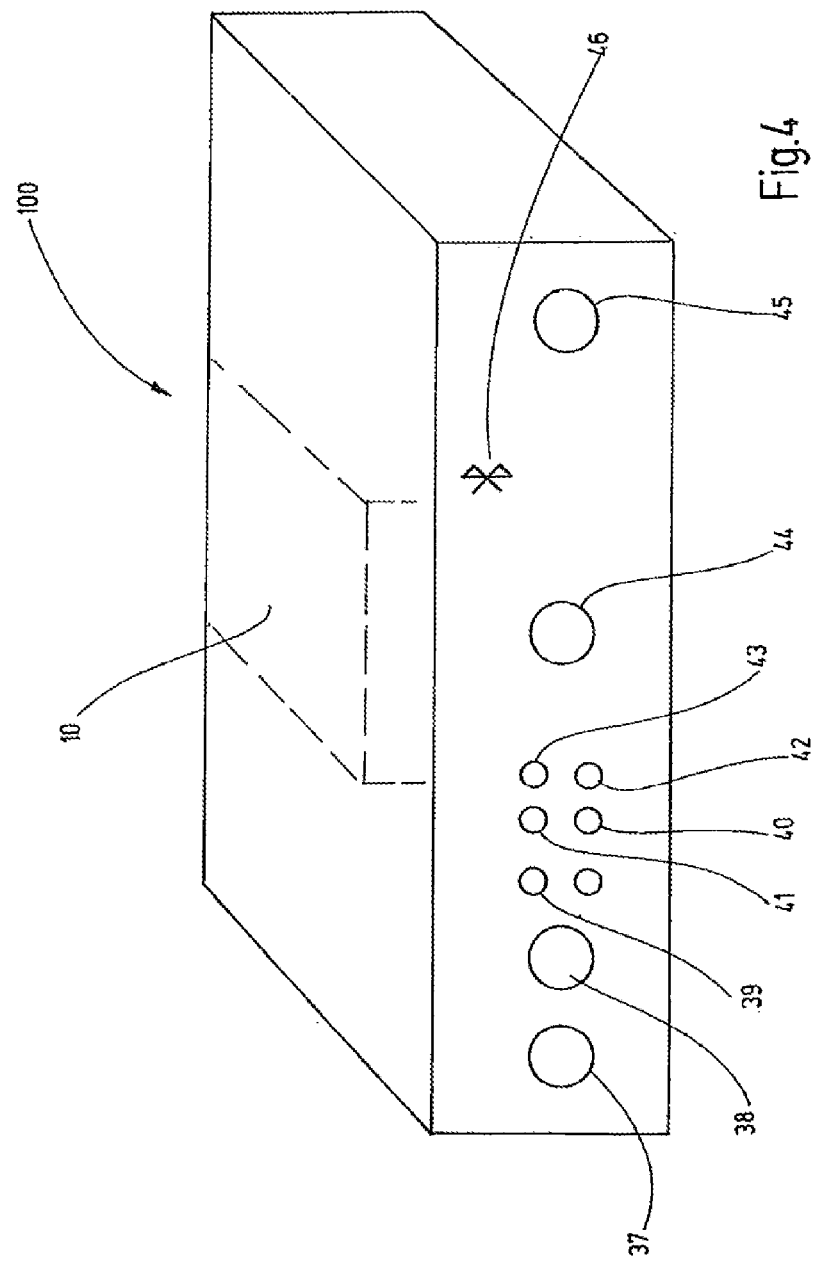

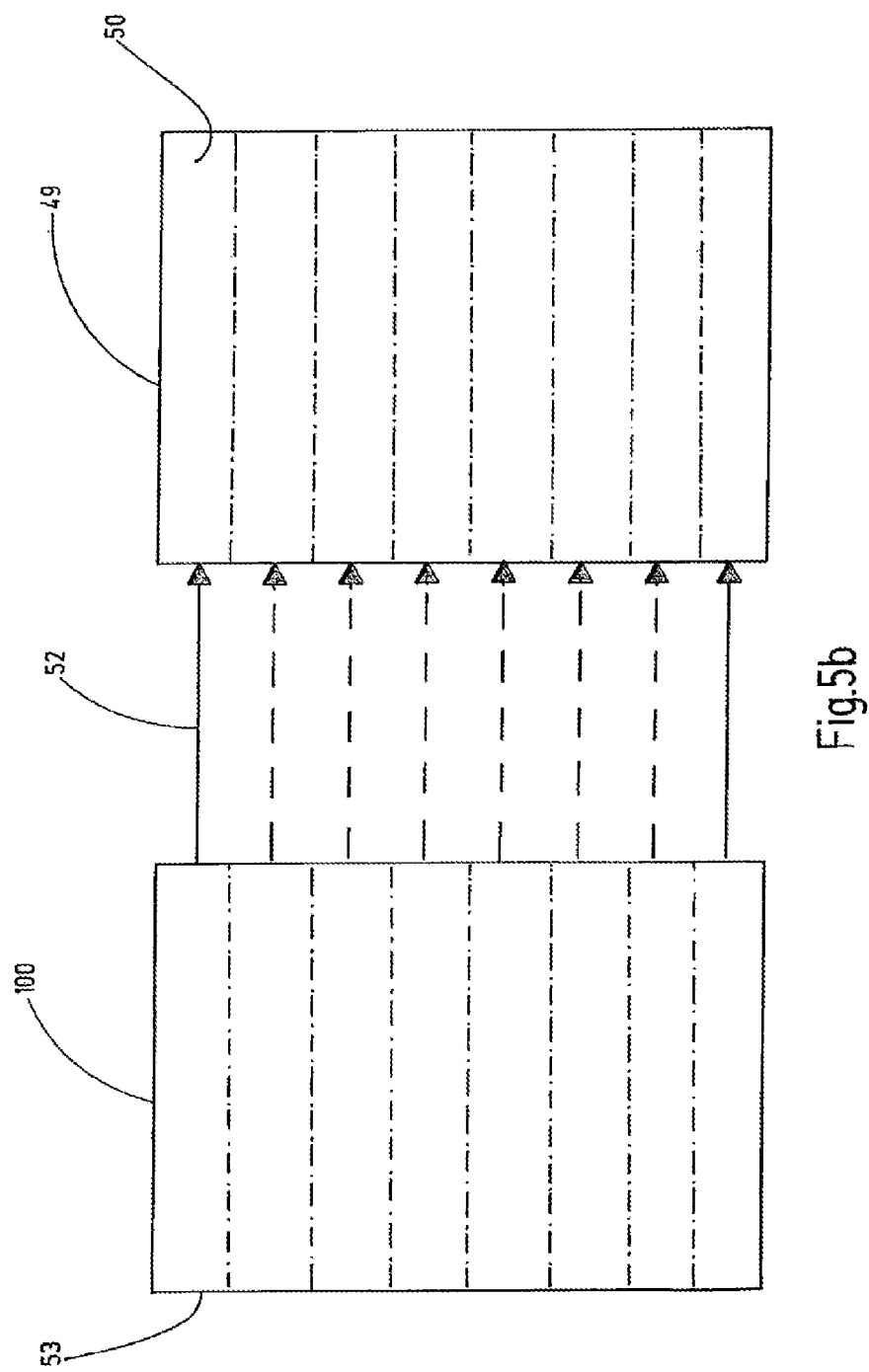

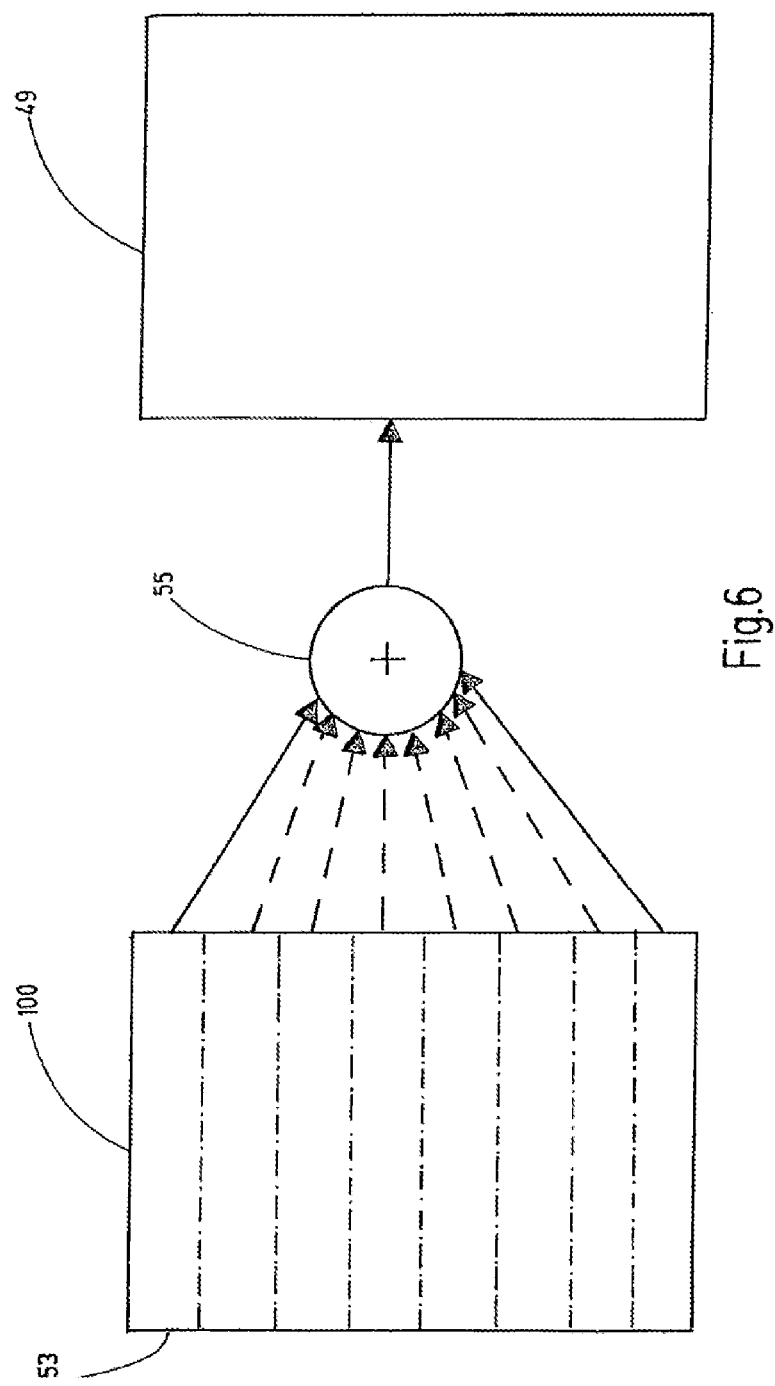

APPARATUS HAVING AN INPUT AND AN OUTPUT AND HAVING AN EFFECT DEVICE WITH VOLUME-REGULATED AUDIO SIGNALS FROM AN AUDIO FILE

The invention relates to a device as claimed in the preamble of claim 1.

A device of this kind is disclosed in U.S. Pat. No. 4,249,042 A.

In the case of this previously known device, an audio compressor is used as effects unit to allow an audio signal to sound as loud as possible by maximizing loudness in parallel with the level of the audio signal. One objective in U.S. Pat. No. 4,249,042 A is to allow a music track that has already been produced to be at a maximum volume to sound even louder on a radio station. For this purpose, the peak levels of audio signals are capped (what are known as the transients) to allow the quieter sound portions to seem louder. In order to reduce audible distortion here, a low-pass filter is provided at 17 kHz in U.S. Pat. No. 4,249,042 A, i.e. the audio signals in the frequency range between 17 kHz and 20 kHz are effectively clipped. To compensate a little for this loss, the frequency band is increased by 4 dB at 15 kHz. A three-band compressor is used for this purpose. If energy peaks arise in the mid band, the compressor regulates all three bands uniformly. If energy peaks arise either in the lower (below 150 Hz) and/or in the upper (above 6 kHz) frequency band, the three bands are each compressed to different extents. The bands are then readjusted individually, which is frequently accompanied by audible down-pumping of the sound which the radio listener is aware of.

The device disclosed in U.S. Pat. No. 4,249,042 A does not solve problems of what is known as the provision of background noise, however.

In the case of the provision of background noise, a sound atmosphere that the listener should perceive, but not be disturbed or distracted by, is intended to be created in the background. This is achieved by adjusting volume, acoustic angles of acoustic sources and the efficiency of the frequency emission thereof with respect to one another and, if necessary, also propagation times in such a way that they can produce uniform sound provision over an area even in the case of low volume. Areas are provided with sound by what are known as loudspeaker grids, i.e. loudspeaker arrangements that are usually at the same distances from one another, specifically to the front and rear and to the left and right. The loudspeakers/acoustic sources are usually located horizontally on the ceiling, but they can also be fitted vertically to walls, or can be in a mixed form of the two. In this case, a wide variety of types and sizes of loudspeakers/acoustic sources are used, irrespective of the type of area to be provided with sound. A construction market with, for example, a ceiling height of 10 meters and an area of 3000 square meters possibly needs different loudspeakers/acoustic sources than a restaurant of 70 square meters and a ceiling height of 3.90 meters. The surfaces of the rooms to be provided with sound also play a role in the selection of the acoustic equipment to be used. Glass surfaces and right angles differ enormously in terms of their sound effect from sound-absorbing surfaces such as fabric and rounded corners, for example. A person skilled in the art can therefore calculate and install a suitable sound provision system with the aid of the conventional sound analysis methods.

However, the problem arises here that, in many areas to be provided with sound, the sound provision system is not designed for listening to music. In shopping centers, superstores, airports, train stations and on cruise ships, for example, the sound provision system is often only designed to be able to provide sound and play appropriate emergency instructions loudly and clearly in an alarm situation, which is also expressed by the fact that music tracks vary in terms of their volume within themselves and compared to one another. For example, a music track that was produced in the 1970s is much quieter in its perceived loudness than a music track produced in the year 2018. Reasons for this are the conventional compression and maximization techniques for loudness that are not conducive to pleasant background music. A desired comprehensive provision of sound is also not achieved by the use of very many loudspeakers over a distance that is excessively close, as their sound overlaps and they generate agglomerations of sound as a result that usually also contain propagation time differences and phase shifts that both have a negative effect on the perception of the sound.

As a result of the variations in the volume and sound density, depending on the sound productions played, the sound in the prior art is additionally localized in the vicinity of the acoustic sources rather than across the breadth of the room. The perception is that more sound is perceived in the vicinity of acoustic sources/loudspeakers than with some distance between acoustic sources/loudspeakers. These so-called gaps in sound, in which there is less sound intensity, divide the sound space into undesired more sound-intensive and less sound-intensive zones. A typical example of this is restaurants in which the guests at some tables hear too much sound and at others hear too little.

It is therefore an object of the present invention to avoid these disadvantages.

This object is achieved by means of the features of claim 1. Advantageous embodiments of the invention become apparent from the dependent claims.

The invention provides, irrespective of the content of the audio file or audio source, for an input level to be assigned to a preset output level, wherein the input level is regulated to the output level.

It is a fundamental concept of the invention to match the volumes of all the contents of audio files or audio sources and therefore also of all the pieces of music to one another such that the music always has the same volume, specifically irrespective of the music styles (techno, classical, etc.). The different music components within songs are also adapted to the selected volume as a result. Therefore, for the first time, uniform sound provision with very high quality is possible. Volumes are matched and gaps in sound are filled.

Therefore, in the device according to the invention, a classical piece of music, the audio signal of which has an input level of e.g. −24 dB, has exactly the same output level that a techno piece of music with an input level of −24 dB has.

The volumes, i.e. the output levels, are preset in the effects unit for this purpose and are based on empirical values for which background music provision that is as optimal as possible is achieved. In this case, regulation can start from a selectable input level.

The preset output levels are based on empirical values. In this case, the musical hearing sensation is the focus in the broader context of hearing. Severe volume regulation operations are avoided since otherwise audible level jumps would result. The listener should not notice the regulation operations but rather should feel that the audio contents have been produced as they hear them, despite the regulation operations. The preset preferably provides a static linear range in the lower volume regions to make quiet contents generally louder and then approaches the upper volume regions with a non-linear range, so that the factor of the volume increase that is becoming ever lower can preferably be cut off as far as the maximum level of 0 dB and regulated dynamically, specifically preferably in such a way that no level jumps above the maximum level of 0 dB occur. It is advantageous to connect a limiter following the volume regulation operation. To achieve a hearing sensation that is as dynamic as possible despite volume matching, the type of processing of the input level to the output level is preferably refined by dynamically regulating delay values, such as attack and release, for example. Attack regulates the time from which the volume regulation curve limiting the dynamics begins to operate after the input level has exceeded the defined threshold value from linearity to non-linearity. Release regulates the time from which the volume regulation curve limiting the dynamics stops operating after the input level has fallen below the defined threshold value from non-linearity to linearity.

For the regulation in the effects unit, i.e. for the regulation of an input level to a preset output level, a processor can be provided with corresponding software that in turn contains an algorithm that is processed by the processor.

Psychoacoustic investigations have revealed that the device according to the invention offers in particular the following advantages and solutions:

The device according to the invention compensates for the dynamic variations in the background music. The device according to the invention compensates for the dynamic variations both across multiple audio contents and within each audio content such that the perceived volume remains constant, but the audio contents nevertheless retain their fundamental sound quality with dynamics that are optimized for background listening.

The device according to the invention stabilizes the sound over all frequencies in such a way that the emission behavior of acoustic sources is intensified. An acoustic source thus emits a constant acoustic pressure that is perceived on the part of the listener as a relatively large emission radius. As a result of this relatively large emission radius of each acoustic source optimized by the device according to the invention, it is possible, for the first time, to install fewer acoustic sources to provide sound uniformly over an area.

The device according to the invention optimizes each type of an existing acoustic system without having to process its individual components and optimizes the sound thereof in real time with a clear improvement in performance of the existing acoustic system as a result.

The device according to the invention ensures that audio sources of various volumes are adapted to one another in terms of their volume in such a way that there are no longer any audio sources that are too loud or too quiet.

The volume behavior is altered by the device according the invention in such a way that quiet and loud passages/sound contents are brought into a uniform predictive context such that a soundscape is formed that is uniform in terms of its perceived volume but remains inherently lively. The sound energy and its direction and contained spatiality are regulated in such a way that the sound contents are finely tuned to one another and their sound intensity is generally intensified.

The result of the device according to the invention is also a sound field that is to be perceived uniformly and that can be created without gaps even in the case of low volume and with a lower number of acoustic sources in comparison to the prior art. Sound contents of different volumes are automatically brought into a harmonious overall context with respect to one another.

In addition, tests using pure voice contents from an audio file have proven that these contents can also be reproduced constantly by way of acoustic sources by the device according to the invention, irrespective of the type of speaker. Voice volumes and distances from a microphone can be adjusted and brought to a volume without the speech or the spoken voice losing its naturalness.

One advantageous refinement of the invention provides for the effects unit to be an audio compressor. An audio compressor is used in audio technology as a regulating amplifier and regulates the volume of audio signals. Important parameters of a compressor are attack, release, threshold and gain, for example. The music material is compressed by way of the audio compressor. The dynamics are reduced. Dynamics are the difference between the quietest and the loudest tone in a piece of music. The use of a compressor is mostly aimed at considerably increasing the loudness of the audio signal. The audio compressor as effects unit in the device according to the invention is also a volume regulator that regulates an input level to a preset output level, however. For this, the audio compressor is in the form of a dynamics processor with corresponding software, wherein the software in turn contains an algorithm that is processed by the processor.

The advantage of using an audio compressor is that it has the possibility of forming a regulating curve, i.e. what is known as the characteristic curve, freely. This characteristic curve regulates the ratio of input level to output level in the whole dynamic range and therefore this ratio can be adjusted very accurately over all dynamic stages. Since the architecture of this characteristic curve can be, for example, linear or non-linear, static or dynamic, it offers the possibility of adjusting the whole dynamic range of audio material very finely and individually, depending on the sound goal sought after. The audio compressor comes very close to the creative possibilities of a musical instrument as a result of the free assignment of input level to output level by characteristic curves and the fine-tuning of the regulating thresholds and times by the regulation operations of attack, release and hold, for example. The invention also makes it possible to match the volumes of multiple audio contents that are heard with one another in the context without accepting sound losses. Sound losses arise in audio contents in particular when the audio compression is aimed at maximizing loudness. In order to maximize loudness of the audio material, the audio material has to be compressed to an extreme extent with simultaneous capping of the peak levels that mostly contain the transients, for example the beat of a drum.

Preferably, the output level of the signal of the audio file is a value of a non-linear characteristic curve that is obtained by measured values and supports uniform volume harmonization for the listener by preferably having what is known as a soft knee characteristic. A soft knee characteristic specifies a soft regulating curve that is bent in its shape, starting from a certain input level. In the context of the invention, a linear characteristic curve determined by measured values is also conceivable, however.

The preset provides a static linear volume increase in the lower volume regions to make quiet contents generally louder and then approaches the upper volume regions with a non-linear characteristic curve, so that the factor of the volume increase that is becoming ever lower can be cut off as far as the maximum level of 0 dB and regulated dynamically, bearing in mind the fact that there should be no level jumps above the maximum level of 0 dB.

If the audio compressor is preferably used, it operates with the non-linear characteristic curve. In contrast to a linear characteristic curve, it is characterized by its having a defined threshold value/operating point, i.e. the threshold from which the regulation operation begins. From this threshold it is advantageous to use a non-linear range with the soft knee characteristic. The soft knee characteristic specifies a soft regulating curve that is bent in its shape, starting from the threshold, as a result of which volume regulation is achieved smoothly within the device according to the invention. For this purpose, it is also advantageous to use long regulating times for the compression parameters of attack, i.e. the response time of the compressor, and release, i.e. the return time of the compressor, and to use a hold parameter. Hold is the time after falling below the threshold until the release operation is initiated.

Since the effects unit within the device according to the invention can have a slow regulating behavior, it cannot be completely ruled out that a few peak levels that arise quickly are not regulated. In order to avoid this and therefore possible overdriving of the level, a limiter can be connected downstream of the effects unit. A further advantageous refinement of the invention therefore provides for a limiter to be arranged between an output of the device and the effects unit and to be connected to the output and the effects unit.

The limiter, too, preferably has a threshold from which the regulation operation begins. This regulation operation starts to have an effect at a significantly greater level than, for example, a compressor connected upstream as effects unit since the limiter should only cut off the peak levels, but not further influence the sound as such. In comparison to a linear characteristic curve of the compressor, when preferably, but not exclusively, using a hard knee characteristic, the regulating curve can bend at −7 dB and is then guided with headroom to a level point below the 0 dB limit. The rise and fall times of the limiter (attack, release, hold) should be selected such that no so-called pumping occurs but the regulating times are not too long so that the limiter can develop its effect to protect against peak levels that possibly arise.

A practicable variant of the invention provides for a leveler, i.e. a further effects unit for modifying the volume of the audio signal applied to the input, to be arranged between an input of the device and the effects unit and to be connected to the input and the effects unit. The leveler ensures that overdriving cannot occur when, for example, the volume modulation of the audio source connected to the input is too high and the audio source therefore exceeds the permissible input peak levels of the device.

In order to produce a more spatial sound stage during sound events, it is advantageous to use a spatializer. Sound stage denotes, for example, the sound field that is formed between two loudspeakers when audio is listened to in stereo. A spatializer aims to expand this sound stage in its sound directions. That is to say: the sound should extend to the left and right beyond the loudspeakers. In a normal stereo field, the loudspeakers are the left and right outer limits of the sound field. If, for example, very small loudspeaker systems are involved, an expansion of the sound field is expedient since the small loudspeaker system consequently sounds as if the loudspeakers were positioned further away from one another. Moreover, spatializers can draw the sound field upward, for example, and also expand it spatially in the direction of the listener who is in front of the loudspeakers. This is referred to as what is known as the virtual surround effect. The spatializer expands the sound stage by addition and subtraction of the input channels in a certain ratio with respect to one another, such that a further sound stage arises. The settings and formulas of the addition and subtraction of the input channels and possibly the adaptation of their propagation times with respect to one another depend on the type of sound event and can be set either individually or generally. In order to achieve these sound possibilities in addition to the automatic volume regulation, a spatializer is preferably connected downstream in the effects unit, i.e. a spatializer is particularly preferably arranged between the output of the sound optimization unit and is connected to the output and preferably a filter and effects unit.

It is advantageous for a filter to be arranged downstream of the spatializer. As a result of this, the sound image can be adapted in term of its frequency image and if necessary can be provided with effects such as hall and echo effects, for example, so as to intensify the sound of the modified sound events. This filter can operate manually or automatically and be based on analog or digital technologies, for example. A further practicable variant of the invention therefore provides for a filter to be arranged between the output of the device and the spatializer and to be connected to the output and the spatializer. A leveler can preferably also be connected downstream of the filter to adjust the output level of the device according to the invention.

In order to be able to control the effects unit of the device according to the invention externally as well, a further advantageous refinement of the invention provides for a sensor to be connected to the effects unit, wherein a control apparatus that controls the effects unit and processes data and/or signals of the sensor is assigned to the effects unit. For example, a speed sensor can capture speeds and changes thereto in a motor vehicle in a conventional way and convert the data determined in this case in a conventional way into a signal that is guided into a control apparatus that is part of the effects unit. The captured data of the sensor are processed in a processor of the control apparatus that is embedded in an effects unit circuit. The processor is configured in terms of programming in such a way that the processor controls the effects unit circuit depending on the speeds captured, i.e. the processor runs an algorithm of corresponding software in such a way that, irrespective of the content of an audio file or audio source, each input level at the input of the effects unit is assigned to a preset output level at the output of the effects unit, specifically depending on the speeds captured, wherein the input level is regulated to the output level. The volume of the volume-regulated audio signals can therefore be increased in the effects unit with increasing speed, for example.

For external control of the effects unit, the effects unit can additionally have a crossfader, wherein a control apparatus that controls the crossfader and processes data and/or signals of the sensor is assigned to the crossfader. A processor also controls the crossfader in this case by virtue of the crossfader as mixing unit being able to apply different volumes to two channels in the effects unit, i.e. the crossfader fades two audio channels into one another such that the volumes or signal intensities of the two channels can change. At one position of the crossfader, the signal intensity of the first channel can be at a ratio of 100 to 0 with respect to the second channel. At the center position of the crossfader, both channels are equally loud. The channel in the effects unit circuit, i.e. the channel that has the stereo signal volume-regulated by the effects unit, and preferably a bypass channel that is also in the effects unit are provided to this end. Both channels preferably have the same input signal that corresponds to the input signal at the input of the effects unit. The processor is configured in terms of programming in such a way that the processor controls the crossfader depending on the speeds captured, i.e. the processor runs an algorithm of corresponding software in such a way that, depending on the speed, the volume of the input signal of the effects unit rises or falls either in the channel in the effects unit circuit or in the unregulated bypass channel.

The device according to the invention can be arranged between at least one audio source and at least one acoustic system. In this case, any type of audio source and any type of acoustic system, such as an active loudspeaker, for example, can be used. The type of connection can be selected freely here, whether it be a wired or wireless signal connection, for example, and whether it be a mono or stereo or multichannel connection that is transferred in analog form, in digital form, via a network or in another way.

A method for improving the sound in a room in which input levels of an audio signal of an audio file or an audio source are regulated in an effects unit to output levels is the subject matter of claim 19. The method is characterized in that, irrespective of the content of the audio file or audio source, a preset output level of the audio signal is assigned to an input level of the audio signal, wherein the input level is regulated to the output level.

The invention will be explained in greater detail below with reference to the drawings, in which, illustrated schematically:

FIG. 1a shows a device according to the invention;

FIG. 1b shows the characteristic curve of an audio compressor of a device from FIG. 1;

FIGS. 2a to 2c show acoustic sources and their provision of sound;

FIG. 3 shows the temporal profile of inventive volume-regulated audio signals and non-volume-regulated audio signals;

FIG. 4 shows the front side of the device according to the invention from FIG. 1;

FIGS. 5a to 5b show connection variants of the device according to the invention from FIG. 1;

FIG. 6 shows a further connection variant of the device according to the invention from FIG. 1;

FIG. 1a shows a device according to the invention, which is provided with the reference sign 100 and is in the form of a portable box-shaped container.

Figure 5A:
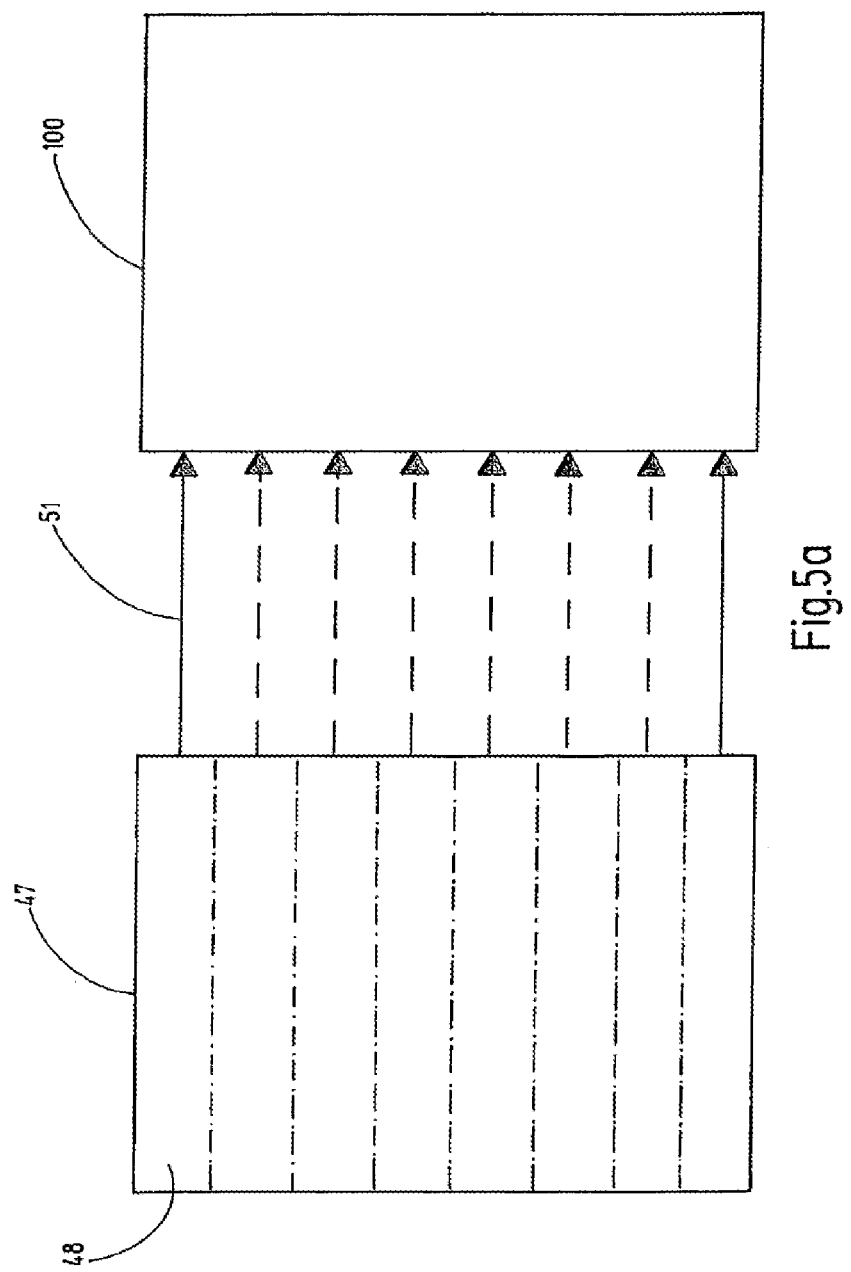

The device 100 has an effects unit that is integrated into the device 100 and is in the form of an audio compressor 10 in the embodiment shown in FIG. 1.

As is further evident from FIG. 1a, the rear side of the device 100 has audio inputs 11, 12 and audio outputs 13, 14 for audio signals. The audio inputs 11, 12 and audio outputs 13, 14 are connected to the audio compressor 10 via signal lines 11a, 12a, 13a, 14a that run within the device.

In the embodiment of the device shown in FIG. 1a, the audio inputs 11, 12 are two asymmetrical RCA connectors that form audio inputs for a left and the right audio channel. The audio outputs 13, 14 are the corresponding asymmetrical audio outputs and are in the form of asymmetrical RCA connectors.

As is further illustrated in FIG. 1a, on its rear side the device 100 is furthermore provided with symmetrical audio inputs 15, 16 and symmetrical audio outputs 17, 18, which are likewise connected to the device 100 via signal lines running within the device 100, these signal lines not, however, being graphically illustrated in FIG. 1a. The audio inputs and outputs 15, 16, 17, 18 are XLR/6.3 mm jack inputs and XLR/6.3 mm jack outputs. The device 100 has the connector 19 for the power supply. The power supply is configured as a 5 V USB connection in the device 100.

The audio compressor 10 fulfils the function of a volume regulator. To this end, in the audio compressor 10, the input levels of the audio signals of an audio file that have passed into the audio compressor 10 via the signal lines 11a, 12a are regulated to output levels that pass via the signal lines 13a, 14a to the audio outputs 13, 14 of the device 100, wherein, in the audio compressor 10, irrespective of the content of the audio file, each input level is assigned to a preset output level, wherein the input level is regulated to the output level. For this, the audio compressor 10 is in the form of a dynamics processor with corresponding software, wherein the software in turn contains an algorithm that is processed by the processor. The volumes, i.e. the output levels in the audio compressor 10, are preset in this case and are based on empirical values that in turn are values of a recorded characteristic curve. A characteristic curve of this kind is shown in FIG. 1b.

FIG. b shows a characteristic curve 24 that is made up of a non-linear range 25 and a linear range 20, wherein the ordinate axis 21 is provided with values of the output levels and the abscissa axis 22 is provided with values of the input levels of audio signals of an audio file.

The characteristic curve 23 in FIG. 1b shows a characteristic curve of audio signals that are not regulated by the audio compressor 10.

As is evident from FIG. 1b, in contrast, the presets of the output levels manifesting themselves in the characteristic curve 24 provide a linear volume increase in the lower volume regions, i.e. in the linear range 20, to make quiet contents generally louder and then approach the upper volume regions in a non-linear manner, so that the factor of the volume increase that is becoming ever lower can be cut off as far as almost the maximum level of 0 dB and regulated dynamically. The effect created as a result is shown in FIGS. 2a to 2c.

In order to achieve a comprehensive provision of sound, according to the prior art the acoustic sources 26 that are shown in FIG. 2a and have a conical emission characteristic are installed in what are known as grids, or else in a manner free of patterns and structures, in a number and of a type depending on the area to be provided with sound. The objective of these installations is both to avoid producing the sound overlaps 30 between the acoustic sources 26, as shown in FIG. 2b, so that the volumes of these do not add together or produce propagation time differences and phase differences that are undesirably audible, and to avoid positioning the acoustic sources 26, as shown in FIG. 2a, too far away from one another so that no acoustic gaps/gaps in sound 27 occur. Nevertheless, a situation arises in which there is a non-comprehensive supply of sound over the area to be provided with sound as a result of too few acoustic sources 26 or too many acoustic sources 26, as a result of which, in turn, the perception of sound varies in intensity at different locations in the area to be provided with sound, which contradicts the ideal of the uniform perception of sound.

In contrast, the device 100 from FIG. 1 stabilizes the sound of an audio signal over all the frequencies such that the emission behavior of the acoustic sources is intensified. An acoustic source therefore emits a constant acoustic pressure that is perceived by the listener as a relatively large emission radius 31, as is evident from FIG. 2c. As a result of the relatively large emission radius 31 of each acoustic source 26 optimized by the device 100, it is possible for the first time to install fewer acoustic sources 26 to provide sound uniformly over an area.

The effect of the device 100 shown in FIG. 1 is also evident from FIG. 3, which shows the profile of an audio signal, wherein the amplitude axis is provided with the reference sign 32 and the time axis with the reference sign 33.

The device 100 from FIG. 1 with the effects unit causes what are known as transients 34 to be retained. Transients 34 are a short percussive sound with a high level at the beginning of a sound event. The transients need not be dependent on the pitch, and they are often non-harmonic. Rather, short sound components that appear percussive are involved here. Transients 34 are important for maintaining the sound quality of the sound event since they are an important sound element, specifically the characteristic beginning of a sound event, for example the beat of a drum, or the plucking sound of a violin or double bass string. The device 100 from FIG. 1a achieves a high-quality sound result by virtue of said device increasing the volume of the transients 34 that are too quiet together with the rest of the sound event, but not changing the form thereof, which is expressed by the waveform 35 shown in FIG. 3, wherein a range 36 of the audio signals that already have an optimum volume are not processed and therefore distorted, i.e. unprocessed audio signals that are shown in the two lower profiles of the audio signals in FIG. 3, and also the audio signals regulated by the device 100 that are shown in the two upper profiles of the audio signals in FIG. 3 and have the same waveform in a range 36 in which unprocessed audio signals already have an optimum volume.

FIG. 4 shows the front side of the device 100 from FIG. 1b, having a switch unit 37 that can switch at least one applied audio input signal over to mono or stereo processing. As is further evident from FIG. 4, on the device 100 there is a switch 38 that is a bypass switch that switches the device 100 in an active manner (bypass off) or inactive manner (bypass on) to allow the unprocessed and the processed audio input signals to be compared in real time. The optical indicator 39 indicates whether the device 100 is in bypass-on or bypass-off mode.

In addition, as is further evident from FIG. 4, there are further optical indicators 40, 41, 42, 43 on the device 100 that indicate possible overdriving of an input level of an audio signal. The input level regulator 44 shown in FIG. 4 is appropriately adapted so that there is no overdriving at the input. The output level regulator 45 regulates the output level of an input level regulated in the effects unit 10 such that there is no overdriving at the input of an acoustic system, which is not shown in FIG. 4. In addition to the wired signal transmission, the device 100 shown in FIG. 4 also has wireless communication that is in the form of a Bluetooth connection 46.

FIGS. 5a, 5b and 6 show various possibilities for the connection of the device 100 from FIG. 1a to other components of an audio system. FIG. 5a shows the connection variant between a number of audio sources 48 of an arrangement 47 of these audio sources 48 that are connected to the audio inputs 51 of the device 100. FIG. 5b shows the connection variant between the device 100 with a plurality of audio compressors 53 and a number of acoustic systems 49, an arrangement 50 of these acoustic systems with their audio inputs 52.

The arrangement of a number of compressors 53 of a device 100 from FIG. 1 is evident from FIG. 6, the volume-regulated audio signals of which are mixed together in a mixing unit 55 before they are then guided as a mixed signal into at least one audio input of an acoustic system 49. The mixing unit 55 is a device in which a number A of audio input signals are mixed together onto a number B of audio output signals. Mixing units of this type are particularly common in music studios in which several audio sources, for example musical instruments, are down-mixed to a stereo source, that is to say to two channels. In addition to the pure mixing function of audio sources, modern mixing units also include the possibility of incorporating internal and external effects units in order to refine the sound result during the mixing operation.

Figure 7:
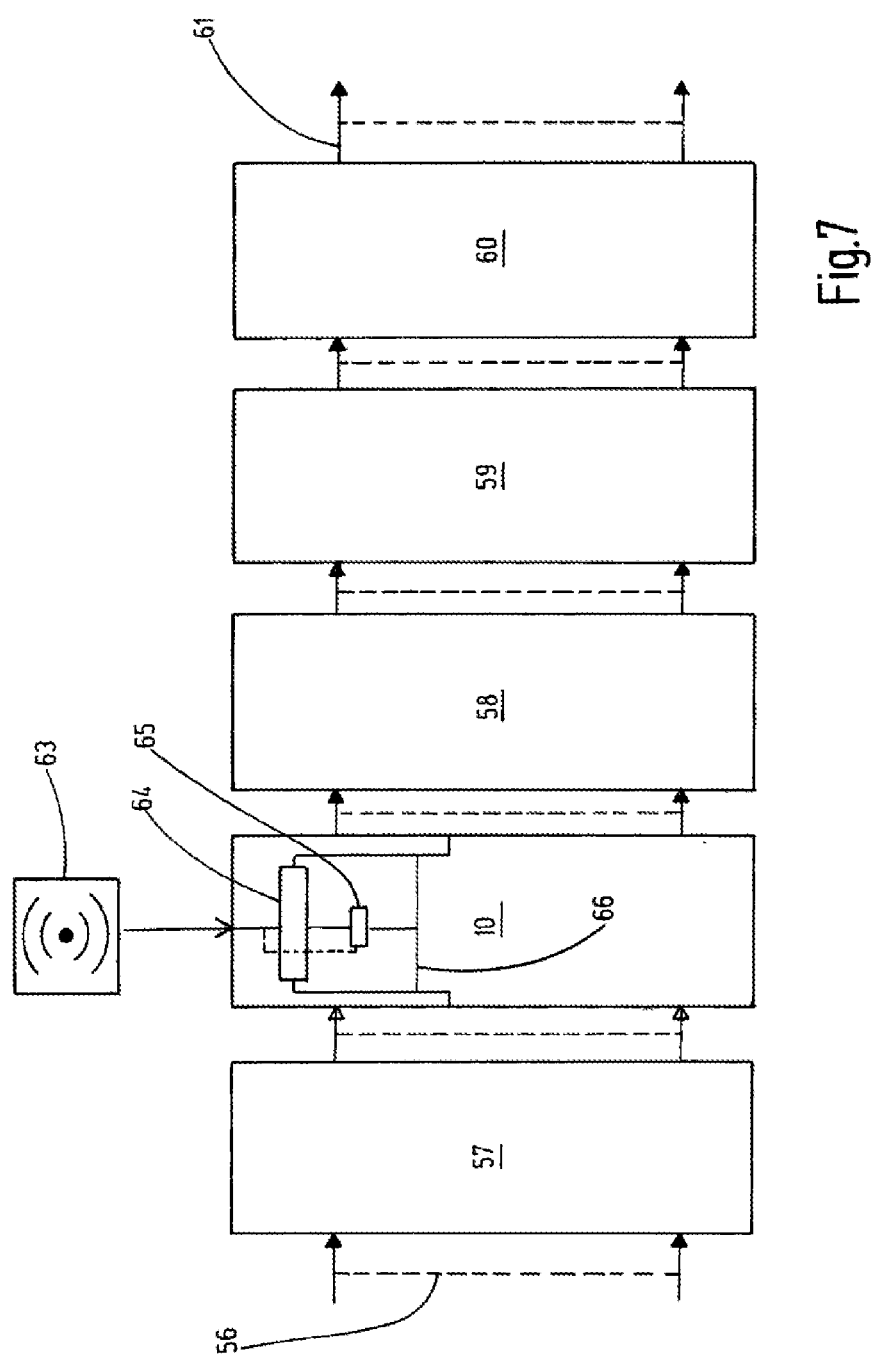
FIG. 7 shows a block diagram of an embodiment of the method according to the invention with an arrangement of further effects units in the device from FIG. 1 and the arrangement with a sensor.

FIG. 7 shows an embodiment of the method of the invention, which begins with an audio input signal 56 from at least one audio source that is not shown in FIG. 7, which signal is applied to the device 100 according to the invention from FIG. 1, being regulated by a leveler 57 in terms of its volume level in such a way that there can be no overdriving within the device 100 on account of different base volumes of audio sources. The leveler 57 can adapt the volume(s) of the applied audio source(s) manually or automatically for further processing by the compressor 10. If the volume level is adapted by the leveler 57, the signal is forwarded to the compressor 10, downstream of which there is also connected a limiter, not shown in FIG. 7. After the audio signal 23 has passed through the limiter, the audio input signal 23 passes into the spatializer 58 and then into a filter and effects unit 59. Here, the sound image can be adapted in terms of its frequency image and if necessary can be provided with effects such as hall and echo effects, for example, so as to intensify the sound of the modified sound events. This filter and effects unit 59 operates manually or automatically and is based on analog or digital technologies. After the filter and effects unit 59, the audio input signal 56 passes through the output leveler 60 connected downstream before it becomes the audio output signal 61.

Optionally, as is further evident from FIG. 7, an effects unit can be connected to a sensor 63, which is a speed sensor, for example, and is in turn situated outside of the device 100 described in FIG. 1 in the embodiment of the invention shown in FIG. 7. The sensor 63 is connected to the compressor 10 in the embodiment of the invention shown in FIG. 7.

The sensor 63 captures speeds and changes thereto in a motor vehicle, which is not shown in FIG. 7, in a conventional way and converts the data determined in this case in a conventional way into a signal that is guided into a control apparatus that is also not shown in FIG. 7 and is part of the compressor 10. The captured data of the sensor 63 are processed in a processor of the control apparatus that is embedded in the effects unit circuit in the form of the compressor circuit 64. The processor is configured in terms of programming in such a way that the processor controls the compressor circuit 64 depending on the speeds captured, i.e. the processor runs an algorithm of corresponding software in such a way that, irrespective of the content of an audio file or audio source, each input level at the input of the compressor 10 is assigned to a preset output level at the output of the compressor 10, specifically depending on the speeds captured, wherein the input level is regulated to the output level. In the embodiment of the invention shown in FIG. 7, the volume of the volume-regulated audio signals increases in the compressor 10 with increasing speed measured by the sensor 63.

Alternatively, as is additionally evident from FIG. 7, the sensor 63 is connected to the crossfader 65 of the compressor 10. The processor also controls the crossfader 65 by virtue of the crossfader 65 as mixing unit being able to apply different volumes to two channels in the compressor 10, i.e. the crossfader 65 fades two audio channels into one another such that the volumes or signal intensities of the two channels can change. At one position of the crossfader 65, the signal intensity of the first channel can be at a ratio of 100 to 0 with respect to the second channel. At the center position of the crossfader 65, both channels are equally loud. The channel in the compressor circuit 64, i.e. the channel that has the stereo signal volume-regulated by the compressor 10, and the bypass channel 66 that is also in the compressor 10 are provided to this end. Both channels have the same input signal that corresponds to the input signal at the input of the compressor. The processor is configured in terms of programming in such a way that the processor controls the crossfader 65 depending on the speeds captured, i.e. the processor runs an algorithm of corresponding software in such a way that, depending on the speed, the volume of the input signal of the compressor 10 rises or falls either in the channel in the compressor circuit 64 or in the unregulated bypass channel 66.

Figure 8:
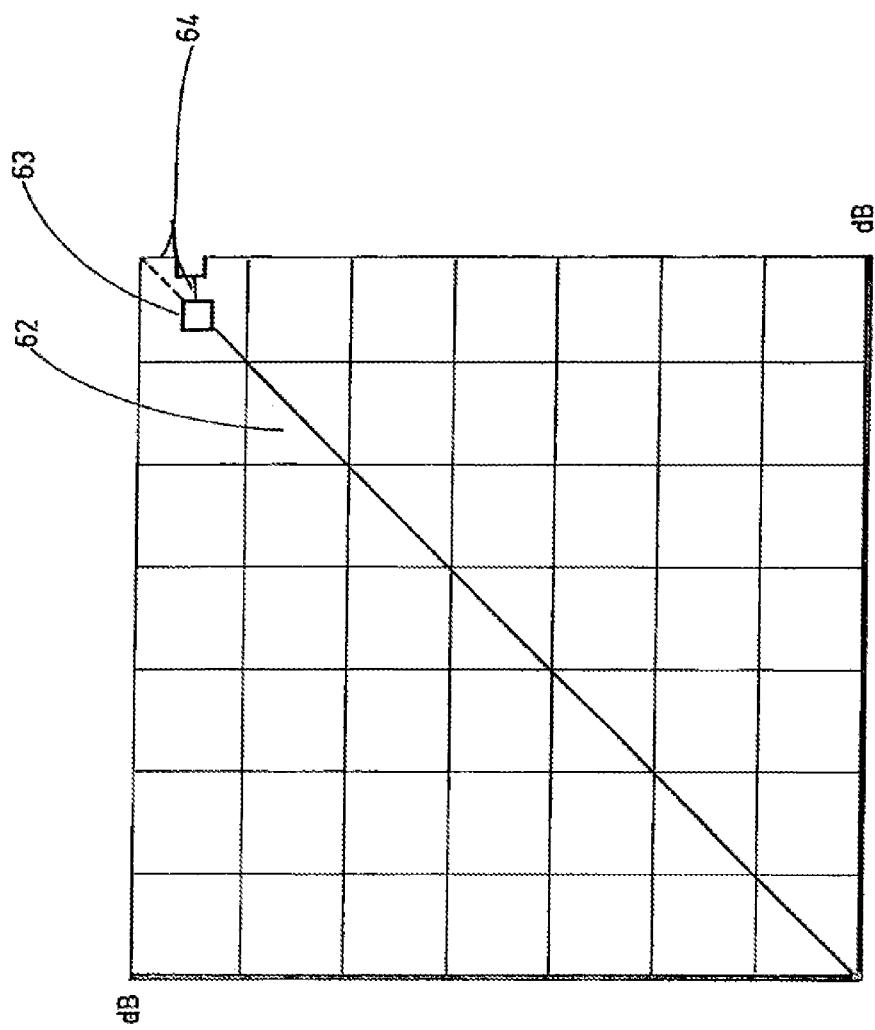
FIG. 8 shows the characteristic curve of a limiter from the method according to FIG. 7.

The limiter from FIG. 7 connected downstream also operates with a characteristic curve 62 that is shown in FIG. 8, wherein the axes in FIG. 8 correspond to the ordinate and abscissa axes from FIG. 1b.

The limiter has a threshold parameter 63 from which the regulation operation begins. This regulation operation starts to have an effect at a greater level than the compressor 10 connected upstream since the limiter should only cut off the peak levels, but not further influence the sound as such. In comparison to the linear region of the characteristic curve 62, when using a hard knee characteristic, there is a curved region 64 at −7 dB that is guided further with headroom to a level point below the 0 dB limit. The rise and fall times of the limiter (attack, release, hold) are selected such that no pumping occurs but the regulating times are not too long so that the limiter can develop its effect to protect against peak levels that possibly arise.

The invention claimed is:

1. A device, comprising
at least one input for receiving audio signals of an audio file or audio source;
a leveler, connected to the at least one input;
at least one output, and
an effects unit, which includes an audio compressor having a compressor input connected to the leveler and having a compressor output, and a bypass circuit configured to selectively bypass the audio compressor, via a path from the compressor input to the compressor output;
a limiter, connected to the compressor output; and
at least one output, connected to the limiter,
wherein the leveler is configured to receive the audio signals at device input levels and, in response, pass the audio signals to the compressor input at compressor input levels,
wherein the audio compressor is configured with an assignment according to a non-linear characteristic curve of each compressor input level to a preset compressor output level, and to perform a regulating from the compressor input level to a compressor output level, wherein:
prior to the compressor input level exceeding a threshold level, the regulating is in accordance with a linear characteristic,
after the compressor input level exceeds the threshold the regulating is in accordance with the non-linear characteristic curve, and
the regulating is irrespective of the content of the audio file or audio source, and
wherein the leveler, the bypass circuit, the audio compressor, and the limiter are mutually configured to output in response to one or more transients in the audio signals received at the at least one input, an output audio signal that retains a form of the one or more transients.

2. The device as claimed in claim 1, wherein the non-linear characteristic curve is based on measured values.

3. The device as claimed in claim 1, wherein the linear characteristic curve is based on measured values.

4. The device as claimed in claim 1, further comprising a spatializer arranged between the at least one output and the limiter, wherein the spatializer is connected to the at least one output and to the limiter.

5. The device as claimed in claim 4, further comprising a filter arranged between the at least one output and the spatializer, wherein the filter is connected to the at least one output and to the spatializer.

6. The device as claimed in claim 5, wherein the leveler is a first leveler and the device further comprises a second leveler arranged between the at least one output and the filter, wherein the second leveler is connected to the at least one output and to the filter.

7. The device as claimed in claim 1, wherein the device is in the form of a box-shaped container, USB stick or headphones.

8. A device comprising
at least one input;
at least one output;
an effects unit with volume-regulated audio signals of an audio file or audio source;
a sensor connected to the effects unit; and
a control apparatus assigned to the effects unit that controls the effects unit and processes data and/or signals of the sensor,
wherein the audio signals have input levels at an input of the effects unit and output levels at an output of the effects unit,
wherein irrespective of the content of the audio file or audio source, each input level is assigned to a preset output level, and
wherein the input level is regulated to the output level.

9. The device as claimed in claim 8, wherein the sensor is connected to an effects unit circuit which produces the volume-regulated audio signals.

10. The device as claimed in claim 8, wherein the effects unit comprises a crossfader, wherein the control apparatus is assigned to the crossfader and is configured to control the crossfader, based on a processing of a data and/or signals of the sensor.

11. An audio arrangement, comprising
an audio source;
an acoustic system;
a device, the device comprising
at least one input,
at least one output, and an effects unit with volume-regulated audio signals of an audio file or audio source;

a sensor connected to the effects unit; and a control apparatus, assigned to the effects unit and configured to receive data and/or signals from the sensor and, based on a processing of the data and/or signals of the sensor, to control the effects unit, wherein the audio signals have input levels at an input of the effects unit and output levels at an output of the effects unit, wherein irrespective of the content of the audio file or audio source, each input level is assigned to a preset output level, wherein the input level is regulated to the output level, wherein the device is arranged between, and connected to, the audio source and the acoustic system.

12. The audio arrangement as claimed in claim 11, wherein the effects unit comprises an effects unit circuit which is configured to produce the volume-regulated audio signals.

13. The audio arrangement as claimed in claim 11, wherein the sensor is connected to a crossfader, wherein the control apparatus is assigned to the crossfader, is configured to control the crossfader data and/or signals of the sensor.

14. The audio arrangement as claimed in claim 13, wherein the sensor is configured to sense a speed of a vehicle.

* * * * *